US010782556B2

(12) United States Patent
Smith et al.

(10) Patent No.: US 10,782,556 B2
(45) Date of Patent: Sep. 22, 2020

(54) SUNLIGHT READABLE LCD WITH UNIFORM IN-CELL RETARDER

(71) Applicant: Sharp Kabushiki Kaisha, Osaka (JP)

(72) Inventors: Nathan James Smith, Oxford (GB); Kiyoshi Minoura, Osaka (JP); Akira Sakai, Osaka (JP); Yuichi Kawahira, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 16/778,108

(22) Filed: Jan. 31, 2020

(65) Prior Publication Data
US 2020/0166800 A1 May 28, 2020

Related U.S. Application Data

(63) Continuation-in-part of application No. 14/811,999, filed on Jul. 29, 2015, now Pat. No. 10,591,767.

(51) Int. Cl.
G02F 1/1335 (2006.01)
G02F 1/1362 (2006.01)
G02F 1/1337 (2006.01)
H01L 27/12 (2006.01)
G02F 1/13357 (2006.01)
G02F 1/135 (2006.01)

(52) U.S. Cl.
CPC .. *G02F 1/133536* (2013.01); *G02F 1/133555* (2013.01); *G02F 1/133605* (2013.01); *G02F 1/133753* (2013.01); *G02F 1/136209* (2013.01); *H01L 27/1281* (2013.01); *G02F 2001/1352* (2013.01); *G02F 2001/133531* (2013.01)

(58) Field of Classification Search
CPC .................................. G02F 1/133528
See application file for complete search history.

(56) References Cited

U.S. PATENT DOCUMENTS

2003/0071952 A1\* 4/2003 Yoshida ............... G02F 1/1393
349/141
2006/0256268 A1 11/2006 Jeong et al.
2007/0014659 A1 1/2007 Dodds
(Continued)

FOREIGN PATENT DOCUMENTS

JP 2008-83492 A 4/2008

OTHER PUBLICATIONS

Choi et al., "P-133: A Novel Portable LCD with New AFFS (AFFS+) Technology for High Transmittance and Superior Sunlight Readability", SID 07 Digest, 2007, p. 706, ISSN/007-0966X/07/3801-0706.
(Continued)

*Primary Examiner* — Edmond C Lau
(74) *Attorney, Agent, or Firm* — Renner, Otto, Boisselle & Sklar, LLP

(57) ABSTRACT

A display device in which ambient light reflections, for example, from IPS or FFS type displays are reduced by a circular polariser (e.g., linear polariser combined with external quarter waveplate) to make the light circular polarized, as it traverses the multiple reflective layers between the polariser and LC layer, and then an internal quarter waveplate converts the light back to linear polarisation before it enters the LC, so the display can operate as normal, while the circular polariser absorbs unwanted reflections of ambient light from within the display.

20 Claims, 18 Drawing Sheets

(56) References Cited

U.S. PATENT DOCUMENTS

| | | | |
|---|---|---|---|
| 2007/0146591 A1 | 6/2007 | Kimura et al. | |
| 2007/0222927 A1* | 9/2007 | Uehara | G02F 1/133634 349/117 |
| 2009/0174843 A1 | 7/2009 | Sakai et al. | |
| 2010/0110351 A1 | 5/2010 | Kim et al. | |
| 2010/0134448 A1 | 6/2010 | Park et al. | |
| 2010/0265583 A1 | 10/2010 | Martin | |
| 2012/0218487 A1 | 8/2012 | Lu et al. | |
| 2012/0282479 A1 | 11/2012 | Everaerts et al. | |
| 2012/0293751 A1 | 11/2012 | Matsushima et al. | |
| 2014/0204325 A1 | 7/2014 | Kimura et al. | |
| 2015/0355490 A1* | 12/2015 | Kao | G02F 1/133305 349/12 |

OTHER PUBLICATIONS

Ochiai et al., "34.5L: Late-News Paper: Low Cost Retarder-less Transflective IPS-LCD", SID 07 Digest, 2007, p. 1258, ISSN/007-0966X/07/3802.

Ge et al., "Single cell gap and wide-view transflective liquid crystal display using fringe field switching and embedded wire grid polarizer", Applied Physics Letters 92, 051109 (2008).

Imayama et al., "57.1: Novel Pixel Design for a Transflective IPS-LCD with an In-Cell Retarder", SID 07 Digest, 2007, p. 1651, ISSN/007-0966X/07/3802.

Lim et al., "High performance transflective liquid crystal display associated with fringe-field switching device", Optics Express vol. 19, No. 9, 25 Apr. 2011, p. 8085.

Huang et al., "P-30: Single Cell Gap Wide-View Transflective LCD using Twist Fringe-Field Switch Mode", SID 10 Digest, 2010, p. 1333, ISSN 0097-966X/10/4103.

Her et al., "P-139: Transflective Fringe-Field Switching Liquid Crystal Display without Any Retarder", SID 10 Digest, 2010, p. 1783, ISSN 0097-966X/10/4103-1783.

Song et al., "Electro-optic characteristics and switching principle of a single-cell-gap transflective liquid-crystal display associated with in-plane rotation of liquid crystal driven by a fringe-field", Applied Physics Letters 87, 011108, (2005).

* cited by examiner

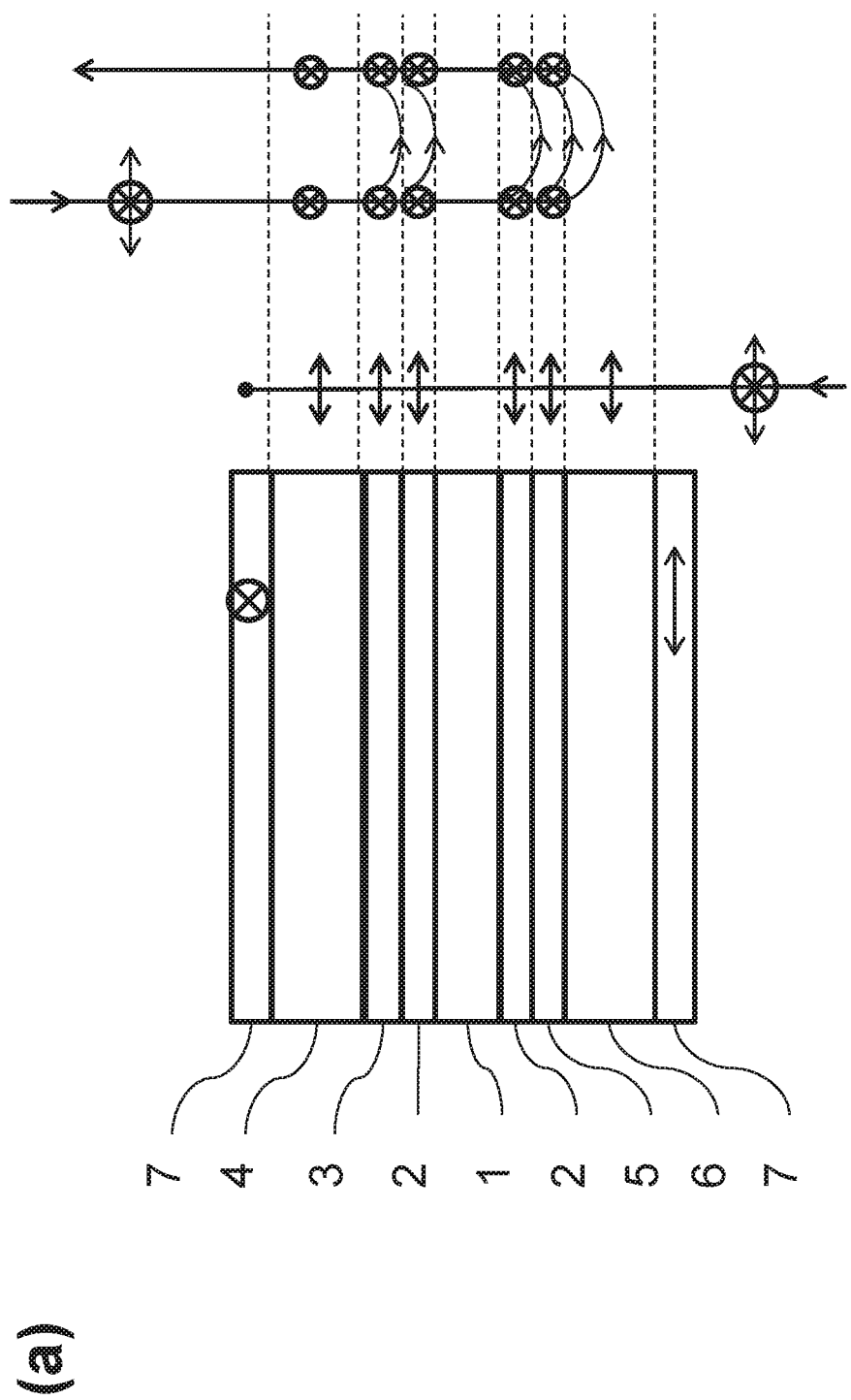

*Figure 6*

|  | Option 1 | | Option 2 | | Option 3 | | Option 4 | |
| --- | --- | --- | --- | --- | --- | --- | --- | --- |
|  | Δn | Optic Axis Azimuth | Δn | Optic Axis Azimuth | Δn | Optic Axis Azimuth | Δn | Optic Axis Azimuth |
| Top substrate external QWP | +ve | -45° | -ve | +45° | +ve | +45° | -ve | -45° |
| Top substrate internal QWP | +ve | +45° | +ve | +45° | -ve | +45° | -ve | +45° |
| Bottom substrate internal QWP | +ve | -45° | +ve | -45° | +ve | +45° | +ve | +45° |
| Bottom substrate external QWP | +ve | +45° | -ve | -45° | -ve | +45° | +ve | -45° |

Figure 13A

Viewing side →

- Linear Polariser 7
- External λ/4 8
- Top Substrate 4
- Patterned Black Mask 18
- Alignment layer for Internal λ/4 17
- Internal λ/4 9
- Patterned Colour Filters 3
- Overcoat 19
- Alignment layer for LC 2
- LC 1
- Alignment layer for LC 2
- Patterned TFT layer 5
- Bottom Substrate 6
- Linear Polariser 7

Figure 13B

Viewing side →

- Linear Polariser 7
- External λ/4 8
- Top Substrate 4
- Patterned Black Mask 18
- Alignment layer for Internal λ/4 17
- Internal λ/4 9
- Patterned Colour Filters 3
- Overcoat 19
- Alignment layer for LC 2
- LC 1
- Alignment layer for LC 2
- Internal λ/4 9
- Alignment layer for Internal λ/4 17
- Patterned TFT layer 5 | Reflective Layer 10
- Bottom Substrate 6
- External λ/4 8
- Linear Polariser 7

Figure 14A

Viewing side →

- Linear Polariser 7
- External λ/4 8
- Top Substrate 4
- Patterned TFT layer 5
- Patterned Black Mask and Patterned Colour Filters 20
- Overcoat 19
- Alignment layer for Internal λ/4 9
- Internal λ/4 9
- Alignment layer for LC 2
- LC 1
- Alignment layer for LC 2
- Bottom Substrate 6
- Linear Polariser 7

Figure 14B

Viewing side →

- Linear Polariser 7
- External λ/4 8
- Top Substrate 4
- Patterned TFT layer 5
- Alignment layer for Internal λ/4 17
- Internal λ/4 9
- Patterned Black Mask and Patterned Colour Filters 20
- Overcoat 19
- Alignment layer for LC 2
- LC 1
- Alignment layer for LC 2
- Bottom Substrate 6
- Linear Polariser 7

SUNLIGHT READABLE LCD WITH UNIFORM IN-CELL RETARDER

RELATED APPLICATION DATA

This application is a continuation-in-part application of U.S. application Ser. No. 14/811,999 filed on Jul. 29, 2015, the content of which is incorporated herein by reference.

TECHNICAL FIELD

The invention has application within the field of consumer electronic displays, particularly transmissive and transflective mobile displays which are intended for some outdoor use and other use in potentially high ambient illumination situations.

BACKGROUND ART

In recent years, the performance of transmissive or emissive type displays such as LCD and OLED has increased significantly in metrics such as resolution, colour gamut capability and brightness, and decreased in cost such that they now form the large majority of the electronic displays market for most applications, both static and mobile, indoor and outdoor use. This has resulted in the retreat of reflective and transflective display types into niche applications for very high ambient illumination, and long battery life requirement applications. Even applications which until very recently a reflective display technology was preferred, such as outdoor signage, e-readers and smart wristwatches, are now largely being served by transmissive or emissive devices, due to their increased image quality capability. In these areas, and others in which a display device may be intended for use mainly in moderate ambient, or only occasionally high ambient situations, such as smartphones, tablets, automotive displays and notebook PCs, transmissive or emissive type displays may be modified to have improved performance in higher ambient lighting situations, with minimal impact on cost and dark room performance. Such modifications include the use of anti-reflection or anti-glare films to reduce reflections from the front surface of the display, and a circular front polariser to absorb reflection of ambient light from within the display. Circular polarisers are particularly effective at removing internal reflections and as result are used in displays such as LCDs in which higher dark room contrast may be obtained using standard linear polarisers (also sometimes referred to as plane polarizers), and OLEDs which do not use polarised light and therefore an emitted brightness loss is incurred.

The dominant LCD display technology for high resolution, narrow-bezel, wide-viewing angle applications such as smartphones and tablets, the Fringe-Field Switching (FFS) mode, is not conventionally compatible with circular polarisers, as at all voltage conditions, including zero, they have a LC director orientation, and therefore optic axis, with a large component in the polarisation plane of on-axis light, so no black state is achievable. This is also true for other commonly used LC modes such as In-Plane Switching (IPS), Twisted Nematic (TN) and Electrically Controlled Birefringence (ECB). These LC modes rely on the use of linear polarisers having a transmissive axis aligned parallel or orthogonal to the projection of the optic axis of the LC in the plane of the cell, in at least one of the display voltage states to produce a particular transmission condition.

Many methods have been developed to add a degree of controlled reflection of ambient light to FFS type displays in order to improve sunlight readability, by the inclusion of a reflective portion in each pixel with voltage controlled reflectivity. This can take the form of increased reflectivity of display electronics portions within the pixel (SID'07 digest, p706, BOE Hydis), or of a mirrored pixel portion used in conjunction with another pixel structure modification such as patterned or additional counter substrate electrodes (SID'07 digest, p1258, Hitachi), (US2014 0204325A1, Semiconductor Energy Ltd), an in-cell reflective polariser (App. Phys Lett, 92, 0501109, 2008, Ge et al). a variable cell gap thickness (SID'07 digest, p1651, Hitachi), (Optics Express, 19, p8085, 2011, Lim at el), patterned LC alignment (US 2010 0110351A1, Chi Mei), (SID'10 digest p1333, HannStar), (SID'10 Digest p1783, LG), but none of these methods reduce uncontrolled reflections from within the display stack, either separately or as part of the method of controlled reflection, and all add cost and manufacturing complexity due the requirement for additional spatially patterned layers to be deposited.

The publication (Applied Physics Letters 87, 011108, 2005, Song et al) describes a transflective FFS type display without additional spatially patterned layers, using two internal quarter wave plates (QWPs) on the lower substrate only, and active matrix electronics on the top (viewer-side) substrate. This structure allows controlled reflections from the reflective portion of the lower substrate only, but due to the two additional QWP layers being adjacent in the transmissive portion of the pixel, does not reduce uncontrolled reflections from any internal interfaces in this area. The second internal QWP serves solely to allow the first QWP to be deposited uniformly over the whole display area without affecting the optics of the transmissive pixel portion. The proposed structure would also add significant uncontrolled reflections from the active matrix electronics on the viewer side, which in a more standard arrangement would at least be attenuated by the reflected light having to pass twice through the colour filter layer.

SUMMARY

It is therefore desirable to provide an LC display in which an LC mode configuration typically used in conjunction with linear polarisers for optimum low ambient light image quality is utilised with a circular front polariser to improve its high ambient lighting appearance, via absorption of the uncontrolled ambient light reflection from internal display components, while retaining the high quality transmissive display performance associated with the mode.

In this invention, this is achieved via the addition of at least one uniform, unpatterned, retarder layer on an inner surface of the LC cell, which returns light provided with a circular polarisation state by an external retarder layer or circular polariser film, back to a linear polarisation state before it enters the liquid crystal material.

To the accomplishment of the foregoing and related ends, the invention, then, comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

BRIEF DESCRIPTION OF DRAWINGS

In the annexed drawings, like references indicate like parts or features:

FIG. 6: is a table outlining optical configurations of quarter wave plate (QWP) layers.

FIG. 13A: is a schematic of the LCD stack arrangement having an alternative positioning of components.

FIG. 13B: is a schematic of the transflective LCD stack arrangement having an alternative positioning of components.

FIG. 14A: is a schematic of the LCD stack arrangement having another alternative positioning of components.

FIG. 14B: is a schematic of the LCD stack arrangement having another alternative positioning of components.

DESCRIPTION OF REFERENCE NUMERALS

Figure 1:
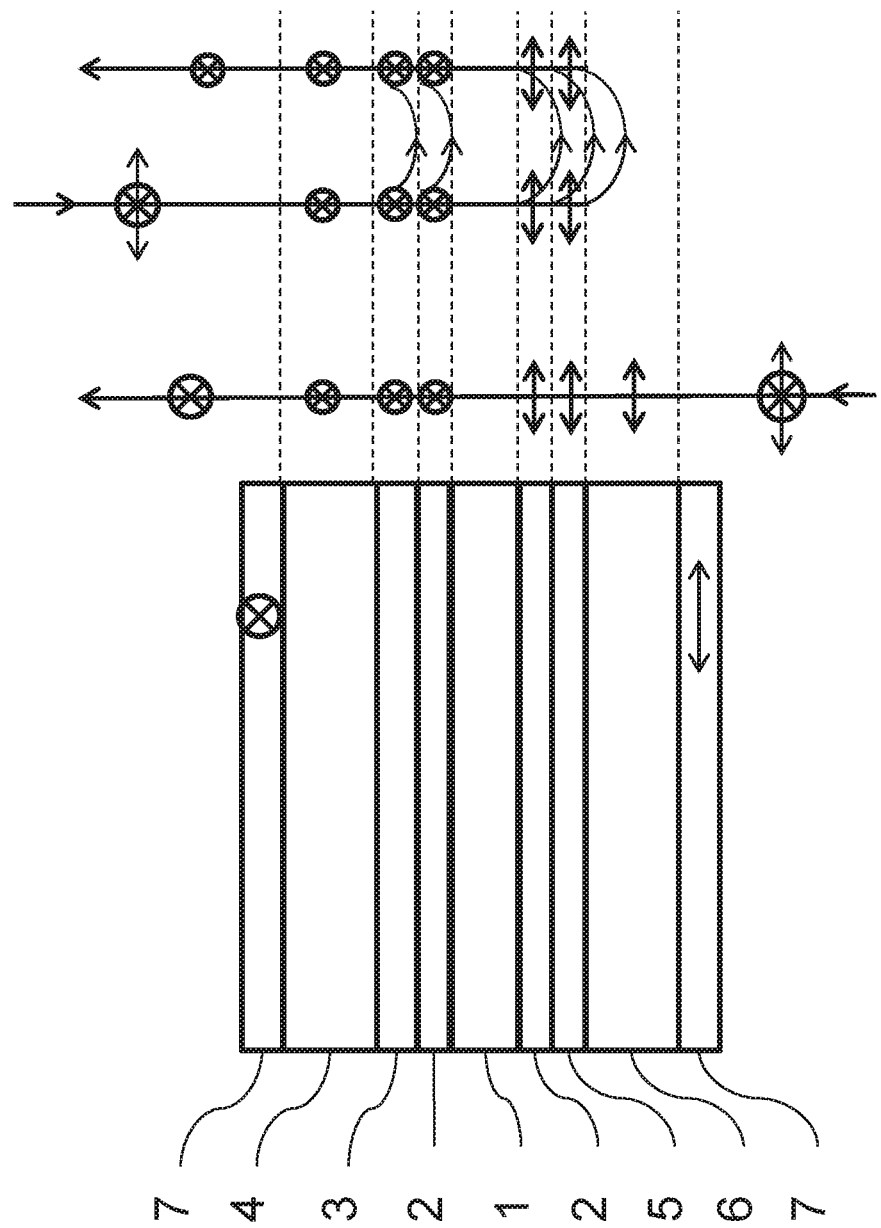
FIG. 1: is a schematic of the optical stack arrangement of an LCD as is standard in the known art, in (a) the minimum transmission (off) state, and (b) the maximum transmission (on) state.

1. Liquid crystal layer
2. Alignment layer
3. Colour filter layer
4. Top (viewer side) substrate
5. Active matrix electronics on pixel array
6. Bottom (backlight side) substrate
7. Polariser
8. External quarter wave plate
9. Internal quarter wave plate
10. Reflection layer element
11. Transmissive pixel portion
12. Reflective pixel portion
13. Touch panel drive electrode
14. Touch panel sense electrode
15. Intermediate substrate
16. Additional LC cell electrode
17. Alignment layer for internal quarter wave plate
18. Patterned black mask layer
19. Overcoat layer
20. Combined patterned black mask and patterned colour filter layer

DETAILED DESCRIPTION

Referring to FIG. 1, a transmissive FFS type LCD of a known configuration which may be considered standard in the art, typically comprises an optical stack configuration in which the liquid crystal (LC) material (1) is sandwiched between two glass substrates with a uniform cell gap of typically 3-5 µm, alignment layers (2) are disposed on the inner surfaces of each substrate adjacent to the LC material to promote a uniform, antiparallel planar alignment of the LC, a colour filter layer (3) is disposed on the inner surface of the top (viewer-side) substrate (4), an active-matrix pixel array and drive electronics (5) are disposed on the inner surface of the lower or bottom (e.g., backlight-side) substrate (6), which also sometimes is referred to as the TFT substrate, and linear polarisers (7), optionally including a number of uniaxial or biaxial retardation films, are laminated onto the outer surfaces of both substrates, resulting in the transmission of linearly polarised light into the display stack from both the backlight (not shown) and from ambient illumination on the viewer side.

The viewer side sometimes is referred to as the viewing side or the outer side of the LCD and is the side at which a person typically would look at or view images on the LCD, from which images may be provided for projection, and so on. Relative to the illustrations in the drawings, the top, upper or outer side of the LCD or of an element, component or layer of the LCD is at the top of the respective illustrations, e.g., is closer to the viewing side than to the other side of the LCD, which other side may be referred to as the bottom, lower, inner, back side, etc. or in some cases backlight-side of the LCD. In some instances the term "inner surface" may represent a surface that is inside the stack of components or layers of the LCD, e.g., between the respective substrates of the LCD, as will be evident from the description with reference to the illustrations in the respective drawings.

The above arrangement is illustrated in FIGS. 1 (a) and (b), along with an indication of the polarisation state of light entering the stack from both sides at each layer interface, for the fully off (a) and fully on (b) LC states, respectively. It can be seen from FIG. 1, that while light transmitted by the display from the backlight to the viewer is modulated by the LC layer as expected to give the intended transmission, unwanted ambient light reflected from internal layer interfaces is re-emitted without control in all LC states, resulting in reduced contrast ratio for the display and degraded image quality.

This disclosure relates to reducing ambient light reflections in liquid crystal displays, and, more particularly from IPS or FFS type displays. IPS and FFS displays have planar (parallel to the cell surface) alignment, and rely on this alignment being parallel to one of the polarisers to produce a black state. In an embodiment of the present disclosure a circular polariser (linear polariser combined with external quarter waveplate for example) is used to make the light circular polarised as it traverses the multiple reflective layers between the polariser and LC layer, then an internal quarter waveplate is used to convert the light back to linear polarisation before it enters the LC, so the display can operate as normal.

Figure 2:
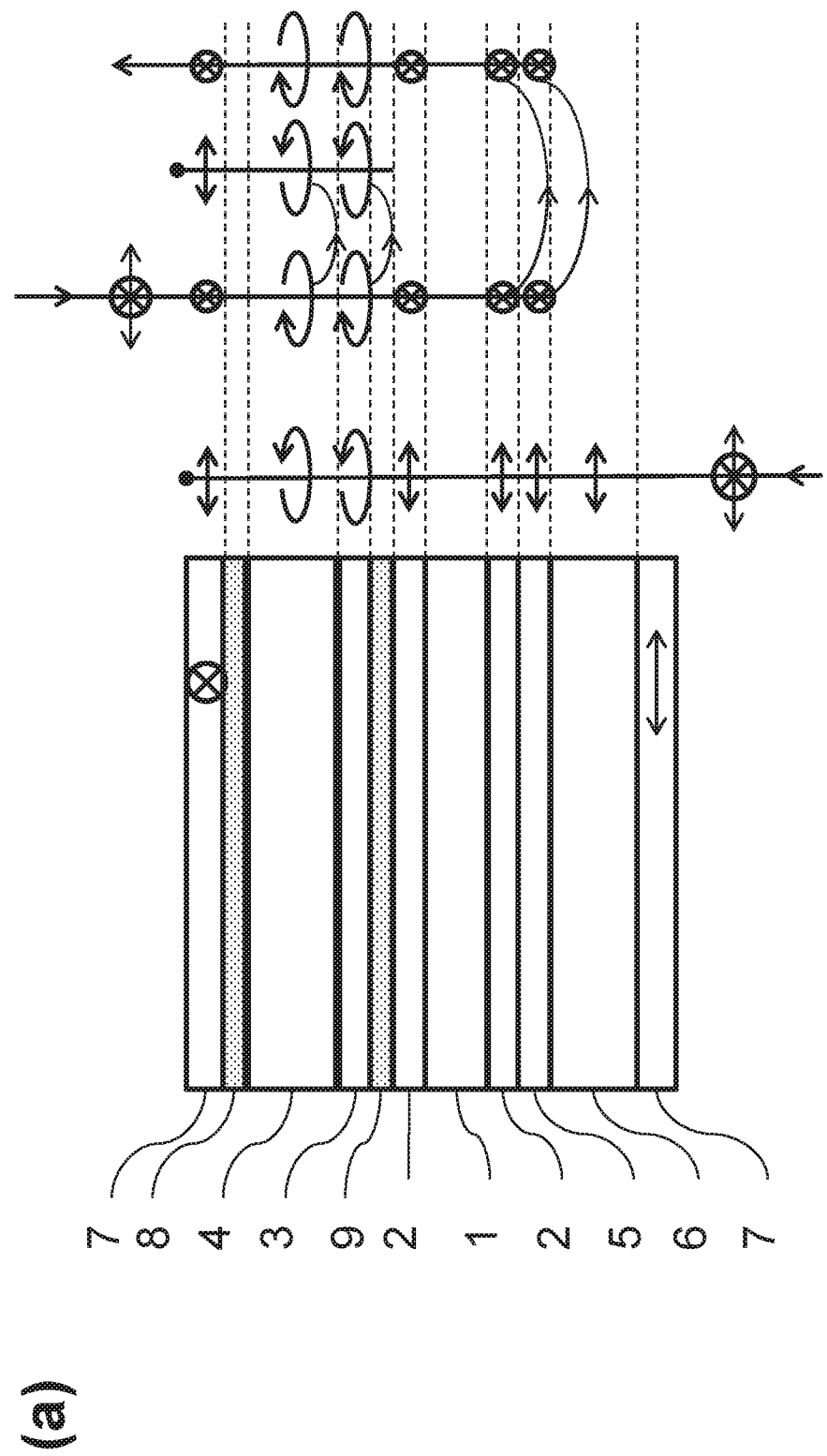
FIG. 2: is a schematic of the LCD optical stack arrangement of an embodiment of this invention in (a) the minimum transmission (off) state, and (b) the maximum transmission (on) state.
Figure 2:
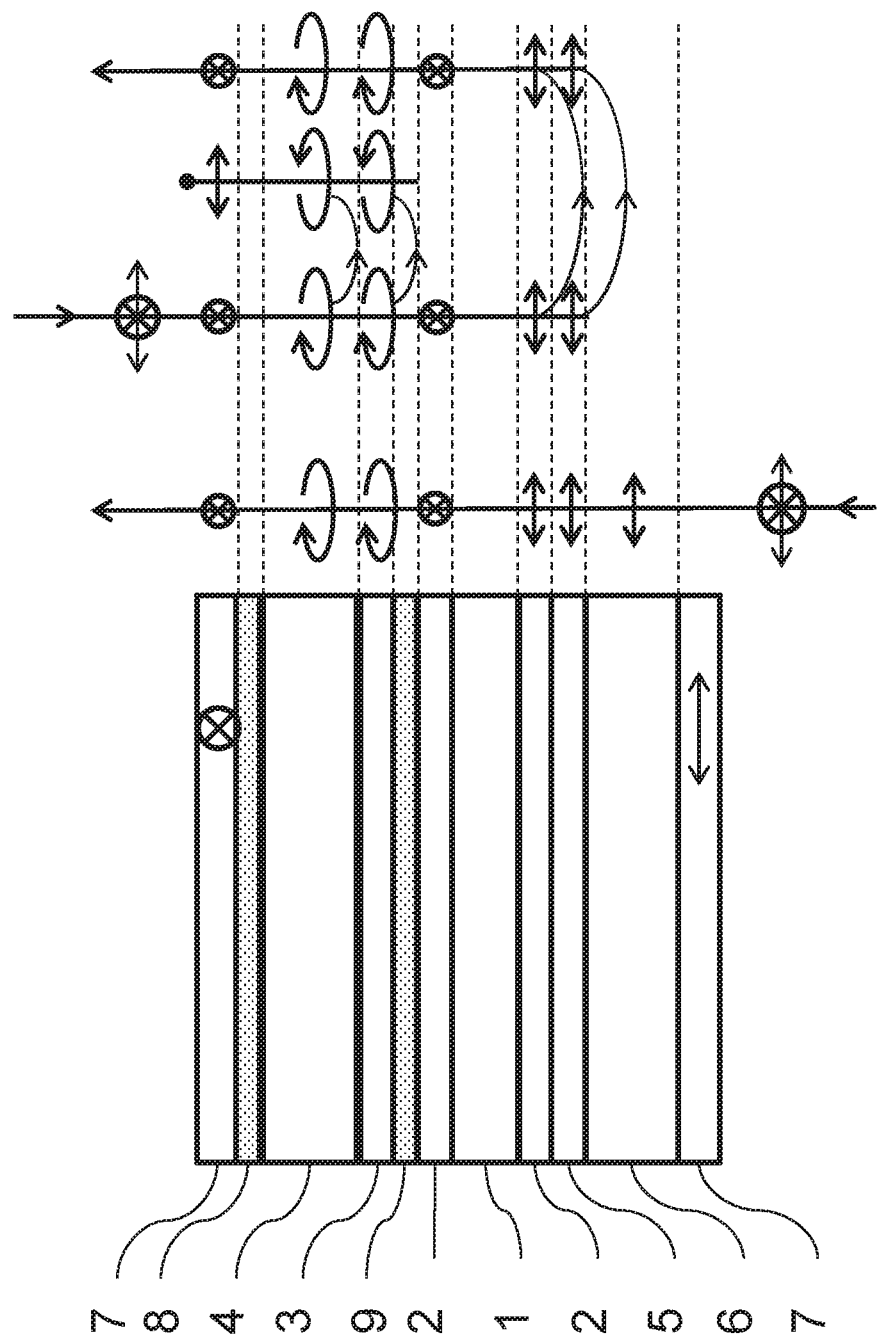

Referring to FIG. 2 and also the other figures that include a colour filter layer, the combination of the outer or top substrate 4 (sometimes referred to as second substrate) with the colour filter layer 3 may be referred to as a colour filter substrate or CF substrate. Also, in FIG. 2 and in other figures the active matrix electronics on a pixel array 5 and the bottom (backlight side) substrate 6 are described. For convenience the bottom substrate 6 may be the substrate part of the TFT substrate of the LCD or the combination of the active matrix electronics on pixel array 5 together with the bottom (backlight side) substrate 6 and may be considered or referred to as the TFT substrate of the LCD.

Referring to FIG. 2, in a first exemplary embodiment, the standard arrangement described above is modified by the addition of an external quarter-wave plate retarder (QWP) (8) between the linear polariser (7) and the top substrate (4), and an internal quarter-wave plate retarder (9) between the colour filter layer (3) and the alignment layer (2) on the top substrate. The effect of these layers in combination is to impose a circular polarisation on ambient light as it enters the top substrate, so that any of this light reflected by the top substrate or the colour filter layer has the handedness of its polarisation reversed (i.e. a π phase change is imposed on reflection), and it is absorbed by the top circular polariser (QWP (8) and linear polarizer (7)) on its way back out of the display stack towards the viewer. Uncontrolled, and therefore unwanted, reflections of ambient light by the display are thereby reduced, improving the image quality.

Light transmitted from the backlight towards the viewer, however, has its polarisation in a linear state due to the lower polariser (7), with electric field vector parallel or perpendicular to the LC alignment direction, and so is modulated by the LC layer (1) in the standard fashion. The LC layer (1) may be referred to as a liquid crystal light modulator. On exiting the LC layer in the black state, the internal QWP (9) retarder imposes a π/2 phase change on the light, resulting in circular polarised light with a handedness dependent on the electrically controlled state of the LC layer. This light is then returned to a linear polarisation state, either parallel or perpendicular to the top polariser (7) transmission axis, dependent on the electrically controlled state of the LC layer, by the external QWP (8) layer. The purpose of the internal QWP (9) and external QWP (8) combination is to maintain the polarisation state of the transmitted light (i.e. leaving the control of transmitted light unaffected) and to cause the top polariser (7) to absorb light reflected from layers internal to the display stack. The light transmitted by the display from the backlight to the viewer is thereby modulated controllably by the LC layer in the same manner as a standard display, resulting in similar high quality display performance.

The structure of the optical stack of this first exemplary embodiment is illustrated in FIGS. 2(a) and (b), along with an indication of the polarisation state of light entering the stack from both sides at each layer interface, for the fully off and fully on LC states respectively. While the two extreme transmission states (fully on and fully off) are illustrated in this figure, it should be noted that for mid-level transmission states (mid grey levels), the display of this embodiment also operates as standard for light transmitted from the backlight to the viewer. In these cases, the polarisation state of the light may have some degree of ellipticity, with both the degree and major axis of the ellipse dependent on the electrically controlled state of the LC layer (1). The effect of the two additional QWP layers (8) and (9) will then be for each to rotate the major axis of the ellipse and alter the ellipticity, but oppositely in each case, so as before when considered in combination they do not change the polarisation state of the light from its condition upon exiting the LC layer.

Figure 3:
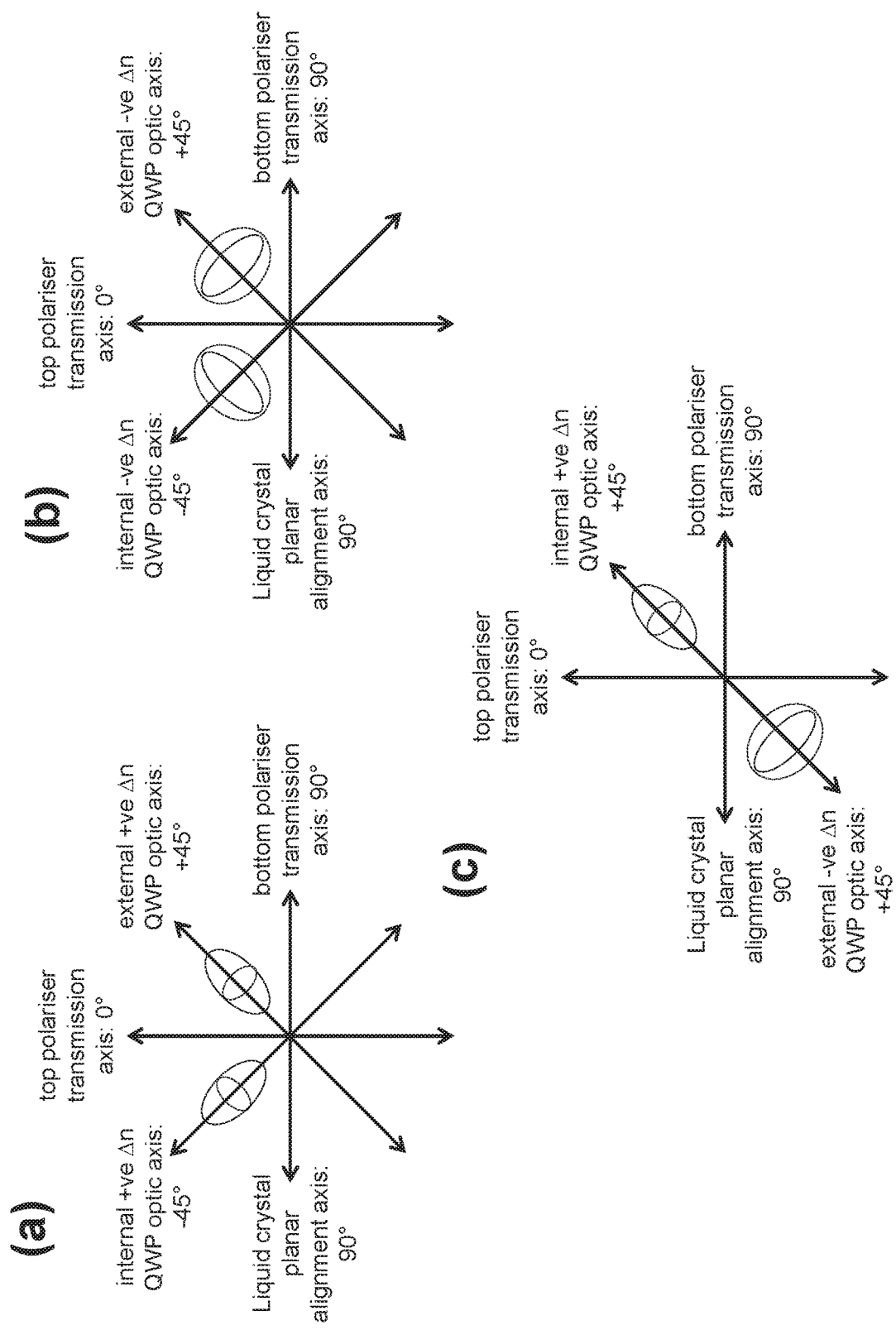
FIG. 3: (a) to (c) is a set of diagrams illustrating possible relative optic axis azimuth alignments and types of some elements of the embodiment of FIG. 2.

Reference is made also to FIG. 3. In order for the additional QWP layers (8) and (9) to operate as described and nullify the polarisation changes of each other, they may be both positively birefringent (+ve Δn) retarders with optical axes aligned at 45° to the polariser transmission and liquid crystal alignment azimuth angles, and at 90° to each other, or they may be both negatively birefringent (−ve Δn) retarders with optical axes aligned at 45° to the polariser transmission and liquid crystal alignment azimuth angles, and at 90° to each other, or one may be a positively birefringent retarder and the other a negatively birefringent retarder, both with optic axis aligned parallel to each other, again at 45° to the polariser transmission and liquid crystal alignment azimuth angles. These angular arrangements are illustrated in FIG. 3 (a) to (c) respectively. It should be noted that for each of the options illustrated the liquid crystal planar alignment axis may be 0°. It should also be noted that for each of the options illustrated, the birefringence polarity of all layers in a combination and/or all optic axis azimuths may be reversed, without altering the principle of operation.

It will be clear to the reader skilled in the art that in order to operate as described, with minimal impact on the darkroom transmissive display quality, in particular contrast ratio, the additional QWP retarders (8) and (9), for example, should effectively cancel each other out as completely as possible, for all wavelengths transmitted by the LCD. For this to be the case, it may be advantageous to use identical material and processing conditions for the internal and external QWP layers. However, this may be impractical as the standard means of applying an external retarder layer is via lamination of a pre-prepared film, often integral to the polariser sheet, and this is not practical for internal retarder layers due to film thickness variations affecting the LC cell gap which must be carefully controlled. Therefore spin or film coating of a curable liquid layer such as a reactive mesogen (RM) is the most commonly used means of depositing an internal retarder layer, and while this may be used for applying both the internal and external QWP layer, this may not be cost effective. Therefore, it may be preferable to utilise a laminated external QWP film in conjunction with a thermo-cured or photo-cured internal RM layer, in which the respective layers have their birefringence and optical dispersion properties matched as closely as possible. If spin or film coating of a curable liquid layer such as a reactive mesogen (RM) is used as the method of depositing either QWP layer, then an additional alignment layer between the substrate and the QWP layer (not shown in figures) may be required to determine the optical axis alignment of the QWP layer (arranged at 45° to the liquid crystal alignment direction in the above embodiments). Additionally, the liquid crystal alignment layer (2) which is then deposited on the internal QWP layer (9) may be deposited via a solution which does not degrade the existing QWP layer.

Which of these configurations is utilised may depend on their relative cost or ease of manufacturing, or may be decided based on the relative wide-view performance of the options, or the practicality or cost of depositing either a positive or negative birefringence type as the internal or external layer. Additionally, while taken in isolation, the combination of the positive and negative birefringence type films with parallel optic axes may offer the most complete mutual cancellation of their optical effects for all angles of light transmission, these layers may be required to work in co-operation with other retarders, such as a biaxial film for overall wide-view improvement of the display, in which case the optical performance of the full system over a range of viewing angles should be considered.

Figure 4:
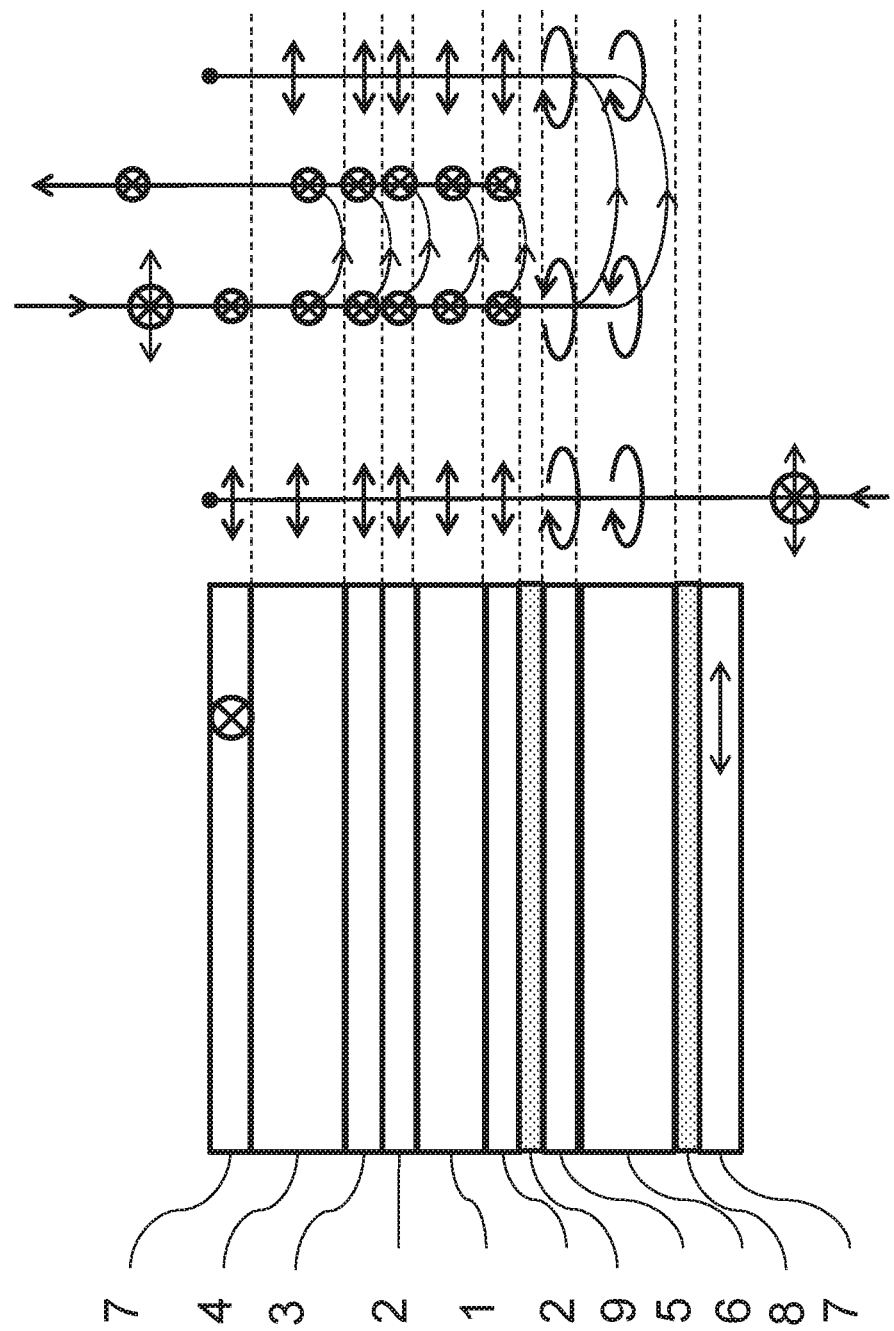
FIG. 4: is a schematic of the LCD optical stack arrangement of an embodiment of this invention in (a) the minimum transmission (off) state, and (b) the maximum transmission (on) state.
Figure 4:
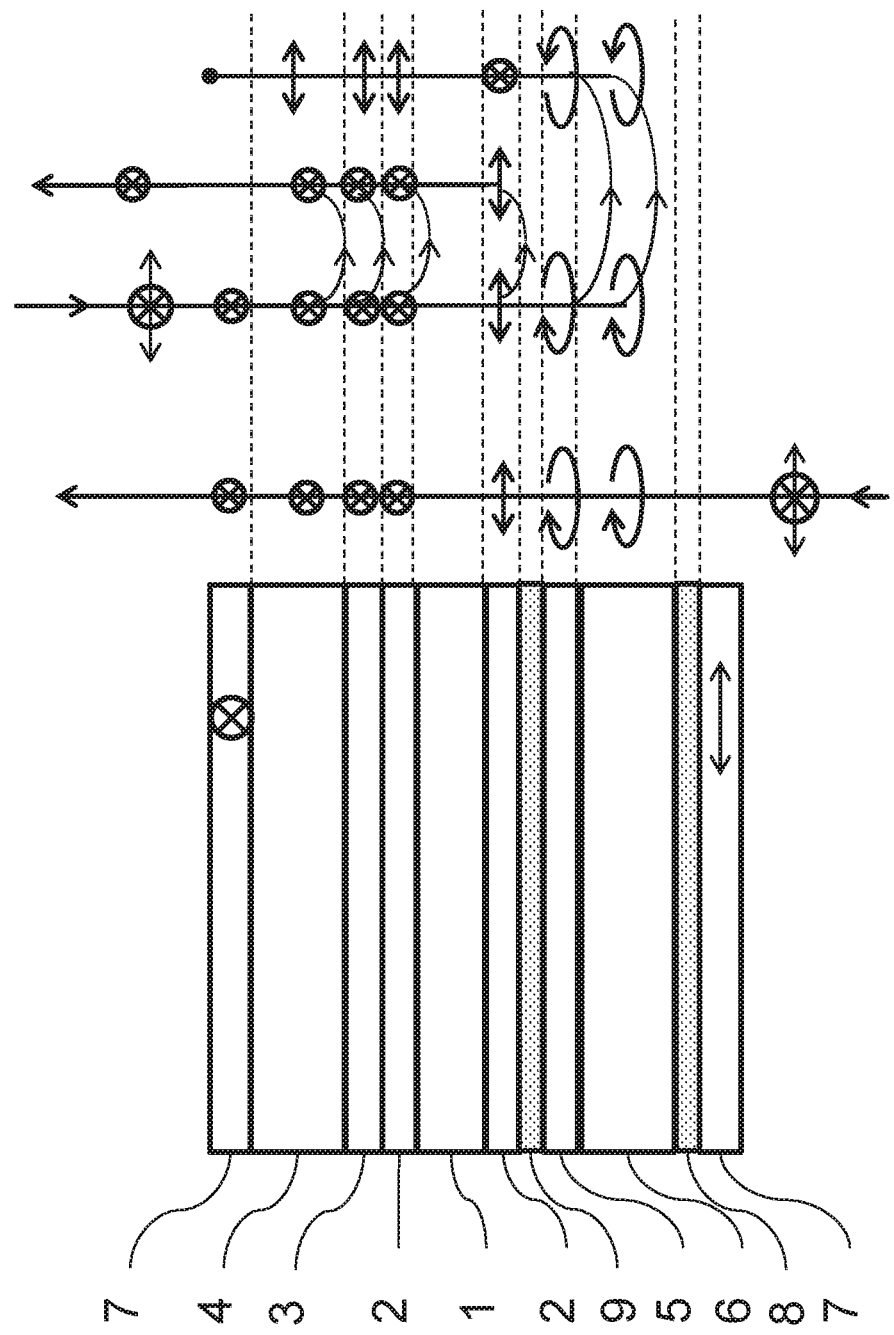

As can be seen from FIG. 2, while this preferred exemplary embodiment eliminates reflections from the top substrate (4) and also from the colour filter layer (3), ambient light reflected from the active matrix electronics and transparent pixel electrodes layer (5) are re-transmitted back out of the display stack to the viewer. This may not be a significant problem as this light has to propagate through the colour filter layer (3) twice and so is strongly attenuated, but depending on the relative magnitude of the reflections from the top substrate interfaces and the lower substrate interfaces, it may be preferable to position the additional QWP layers (8) and (9) on the lower (or bottom) substrate (6) so as to eliminate reflections from this part of the display. This arrangement forms the basis of a secondary exemplary embodiment and is illustrated in FIGS. 4 (a) and (b), again for the fully off and fully on LC states respectively.

Figure 5:
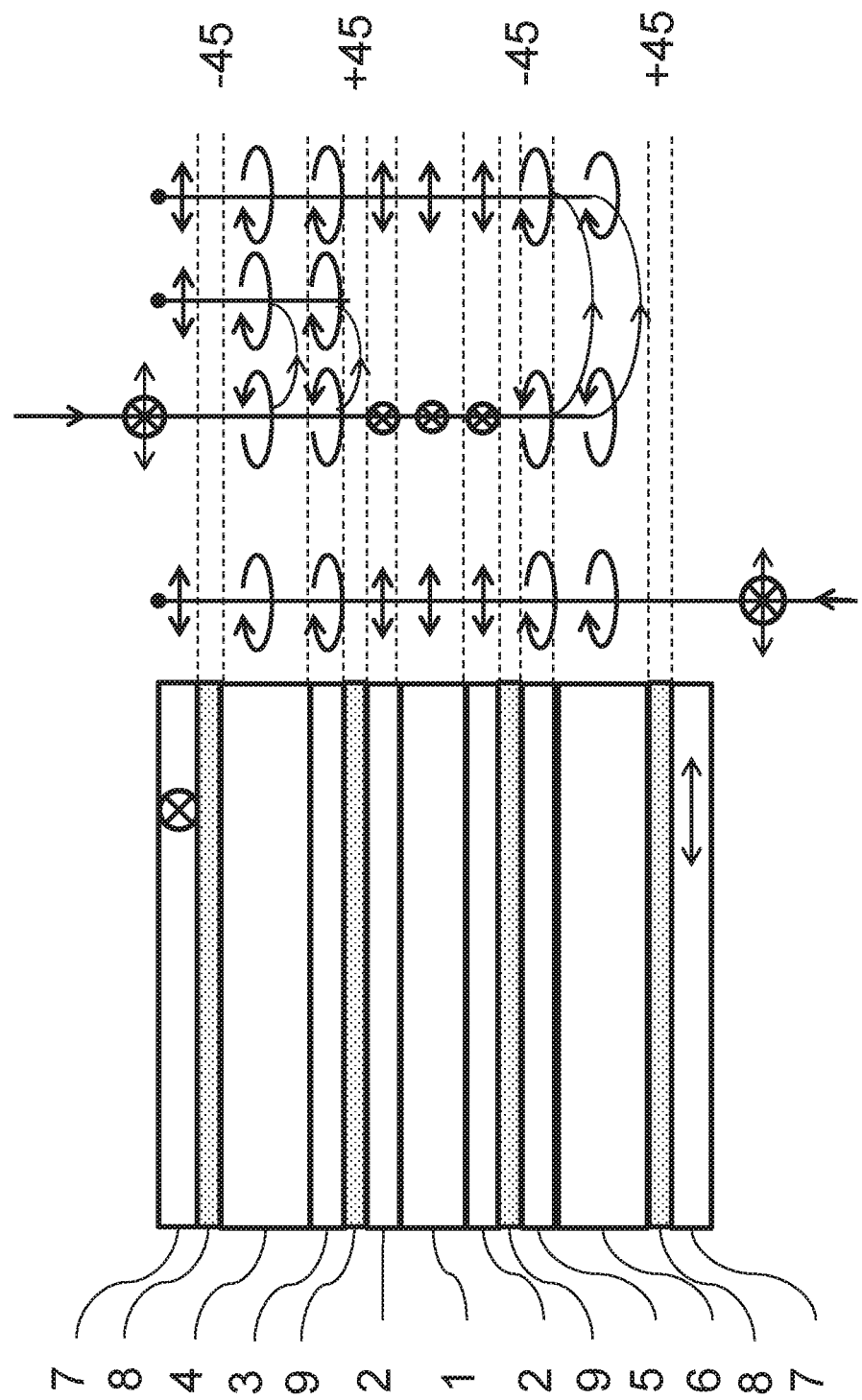
FIG. 5: is a schematic of the LCD optical stack arrangement of an embodiment of this invention in (a) the minimum transmission (off) state, and (b) the maximum transmission (on) state.
Figure 5:
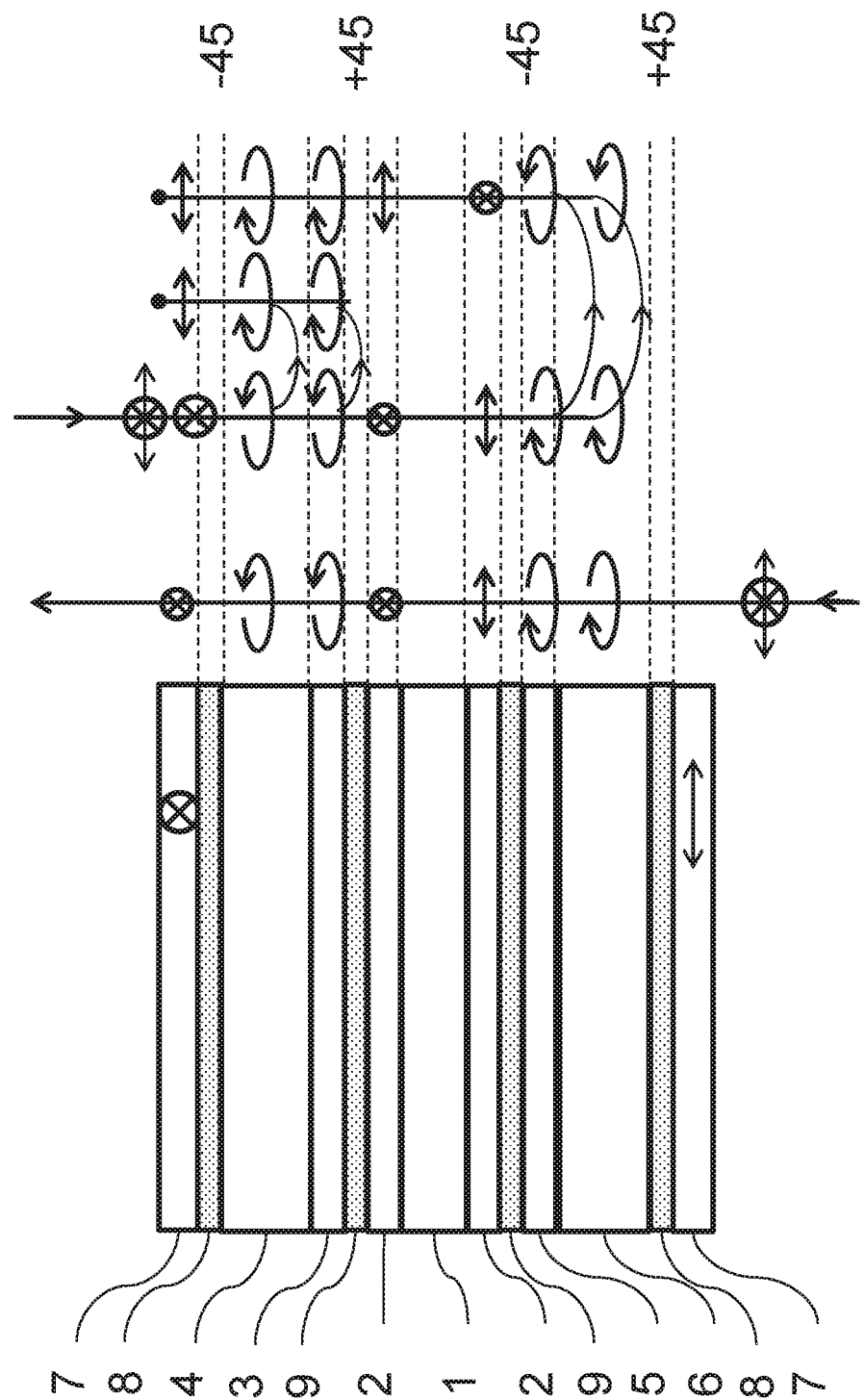

Reference is made to FIG. 5. In a third exemplary embodiment, uncontrolled internal reflections originating from both the top substrate (4) and the bottom substrate (6) are eliminated via the use of dual internal QWP layers (9) and external QWP layers (8) on both substrates. In addition to the more complete suppression of internal reflections, this arrangement, illustrated in FIGS. 5 (a) and (b), for the fully off and fully on LC states respectively, has the further advantage that the two internal QWP layers (9) may have their optic axes at +45° and −45° to the LC alignment direction, and therefore at 90° to each other, and similarly the two external QWP layers (8) may have their optic axes at +45° and −45° to the LC alignment direction, and therefore also at 90° to each other. In this arrangement, any difference in optical characteristics (birefringence, dispersion, etc.) between the material used in the internal and external retarder (QWP) layers will not affect the overall optics of the system, as there are two layers of each material type aligned at 90° to each other and therefore exactly compensating each other, at least in the case of the LC layer (1) being in an optically neutral condition.

Reference is made also to FIG. 6. The internal (9) and external (8) QWP layers on a given substrate may be arranged with their optic axes at 90° to each other if both layers have positive birefringence (+Δn) or both layers have negative birefringence (−Δn). The internal (9) and external (8) QWP layers on a given substrate may be arranged with their optic axes parallel if one of the internal QWP or external QWP material types is of positive birefringence and the other negative birefringence. Alternatively, if the two internal QWP layers are of opposite birefringence polarity, they may have their optic axes aligned parallel to each other, and at 90° to the optic axis of the external QWP layer on the same substrate, if that external layer is of the same birefringence polarity, or parallel to the optic axis of the external QWP layer on the same substrate if that external layer is of opposite birefringence polarity. These four optional configurations are illustrated in FIG. 6, and which of these may be utilised may depend on the relative degree of completeness of optical compensation that may be achieved between internal and external QWP material types of the same or opposite birefringence polarity, for a range of viewing angles. It should also be noted that for each of the options illustrated, the birefringence polarity of all layers in a combination and/or all optic axis azimuths may be reversed, without altering the principle of operation. Again, the purpose of each internal QWP and external QWP pair combination is to maintain the polarisation state of the transmitted light (i.e. leaving the control of transmitted light unaffected) and to cause the top polariser to absorb light reflected from layers internal to the display stack.

Figure 7:
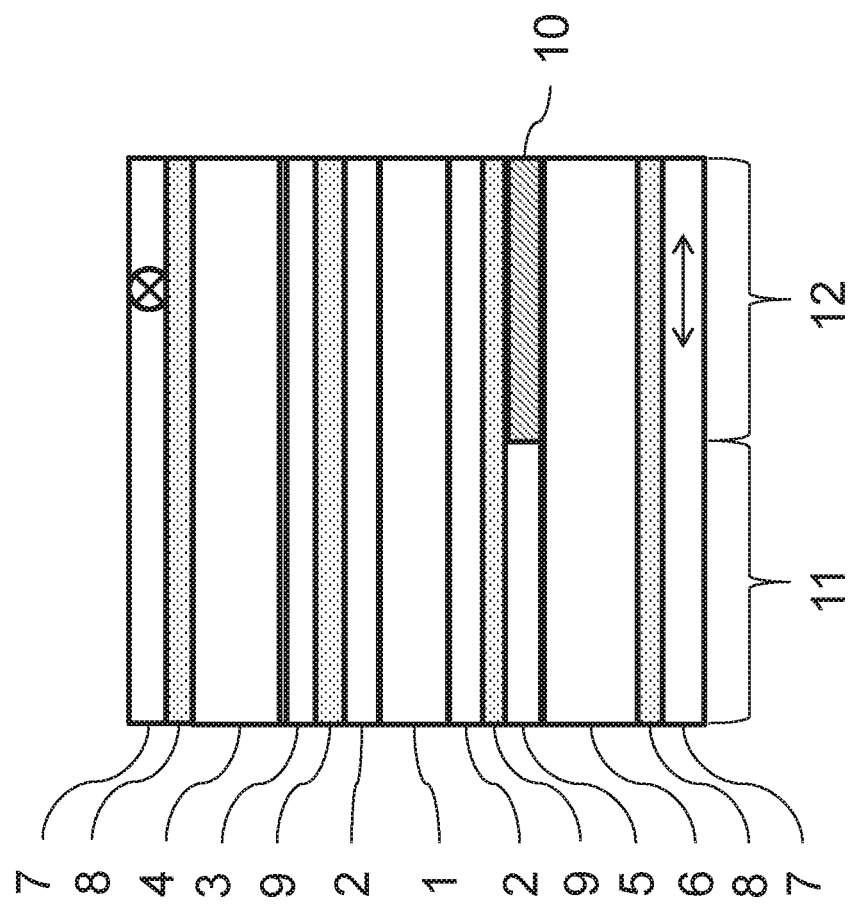
FIG. 7: is a schematic of the LCD optical stack arrangement of another embodiment of this invention having both transmitting and reflective parts or regions of a pixel area.
Figure 8:
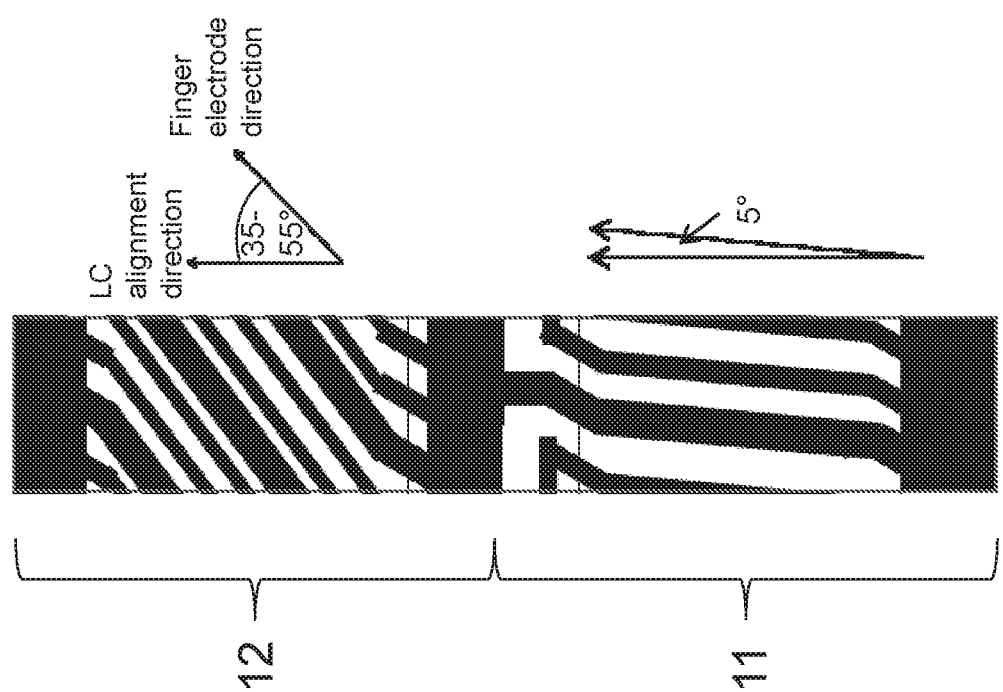
FIG. 8: is a plan view schematically illustrating exemplary electrode finger angles of respective transmitting and reflective pixel regions shown in FIG. 7.

Reference is made to FIGS. 7 and 8. In a fourth exemplary embodiment, the device configuration of FIG. 5 is modified to include a reflective element (10), e.g. a metallic mirror layer, over at least part of the area of each pixel on the lower substrate (6). This mirror layer may be incorporated into the pixel or Vcom electrodes of this area of the pixel (i.e. replacing the transparent electrode material, typically ITO, with a metallic material e.g. aluminium, or it may be disposed beneath the existing transparent electrode layers. In either case, the purpose of the reflective element (10) is to cause the part of the pixel region which it occupies (12) to operate in a reflective mode only, thereby providing in combination with the unmodified transmissive part of the pixel area (11) a transflective display mode. The arrangement of this embodiment is illustrated in FIG. 7.

In this mode, the use of the uniform internal retarder layers allows transflective operation of the display without the need to spatially pattern any optical elements of the display other than the reflective element (10), nor modify the uniform thickness LC layer (1) to have different cell-gap thicknesses in the transmissive and reflective pixel portions, as is common in other transflective display devices. This may be advantageous in terms of simplicity and therefore cost of manufacture.

In order for the transmissive (11) and reflective (12) portions of each pixel in this embodiment to operate collaboratively, such that minimum transmission through the transmissive region occurs under the same driving conditions as minimum reflection from the reflective region, and likewise maximum transmission coincides with maximum reflection from the two regions, respectively, the LC director in the two regions must be parallel to one of the linear polarisers (7) in the minimum brightness state (e.g. unperturbed from the zero voltage alignment condition in both regions), but in the maximum brightness state the LC director should be reoriented so as to result in a 90° rotation of the linear polarisation of the light in the transmissive region, as is standards in FFS type displays, but reoriented so as to result in a 45° rotation of the linear polarisation of the light in the reflective region.

This may be achieved by having separate voltage control of the pixel electrode portions in each of the transmissive (11) and reflective (12) regions (i.e. with additional active matrix array elements and TFTs, or it may be achieved using a dielectric layer over the reflective portion to reduce the effective field strength within, and/or reduce the effective thickness of, the liquid crystal layer (1), or perhaps most simply it may be achieved via altering the pixel electrode geometry in the reflective portion from the standard pattern used in the transmissive portion. In a conventional FFS type display with a positive Δε LC, the pixel common electrode is uniform over the pixel area, and the pixel electrode consists of thin finger regions angled at typically 5° to the LC alignment direction, so when a voltage is applied between these two electrodes, the electric field fringes into the LC material, causing the LC director to rotate largely in the plane of the cell, in a direction towards the normal to the electrode finger direction. A small finger angle is chosen to maximise the effective electric torque on the LC director, while providing a clear preference for the direction of rotation. Simulation results suggest that if the angle of the pixel electrode fingers is altered to approximately 46° in the reflective pixel portion, then the same voltage between pixel electrode and common electrode which results in a 90° rotation of the input polarisation state in the transmissive pixel region, and therefore maximum transmission, will result in a rotation of the polarisation state in the reflection pixel portion of approximately 45°, and therefore maximum reflection. This proposed pixel electrode finger geometry modification is illustrated in FIG. 8, showing the transmissive (11) and reflective (12) pixel regions in plan view, rather than the cross-sectional view of FIG. 7. The optimum electrode finger angle relative to the LC alignment direction for the reflective region is a function of the specific LC material used and therefore the optimum angle may be in the range 35° to 55°.

Alternatively, in a conventional FFS type display with a negative Δε LC, the pixel common electrode is uniform over the pixel area, and the pixel electrode consists of thin finger regions angled at typically 85° to the LC alignment direction, so when a voltage is applied between these two electrodes, the electric field fringes into the LC material, causing the LC director to rotate largely in the plane of the cell, in a direction away from the normal to the electrode finger direction. The finger angle is chosen to maximise the effective electric torque on the LC director, while providing a clear preference for the direction of rotation. The optimum electrode finger angle relative to the LC alignment direction for the reflective region is a function of the specific LC material used and therefore the optimum angle may be in the range 35° to 55°. The optimum electrode angle relative to the LC alignment direction enables the same voltage between pixel electrode and common electrode which results in a 45° rotation of the LC director in the transmissive pixel region, and therefore maximum transmission, will result in a rotation of the LC director in the reflection pixel portion of approximately 22.5°, and therefore maximum reflection.

Figure 9:
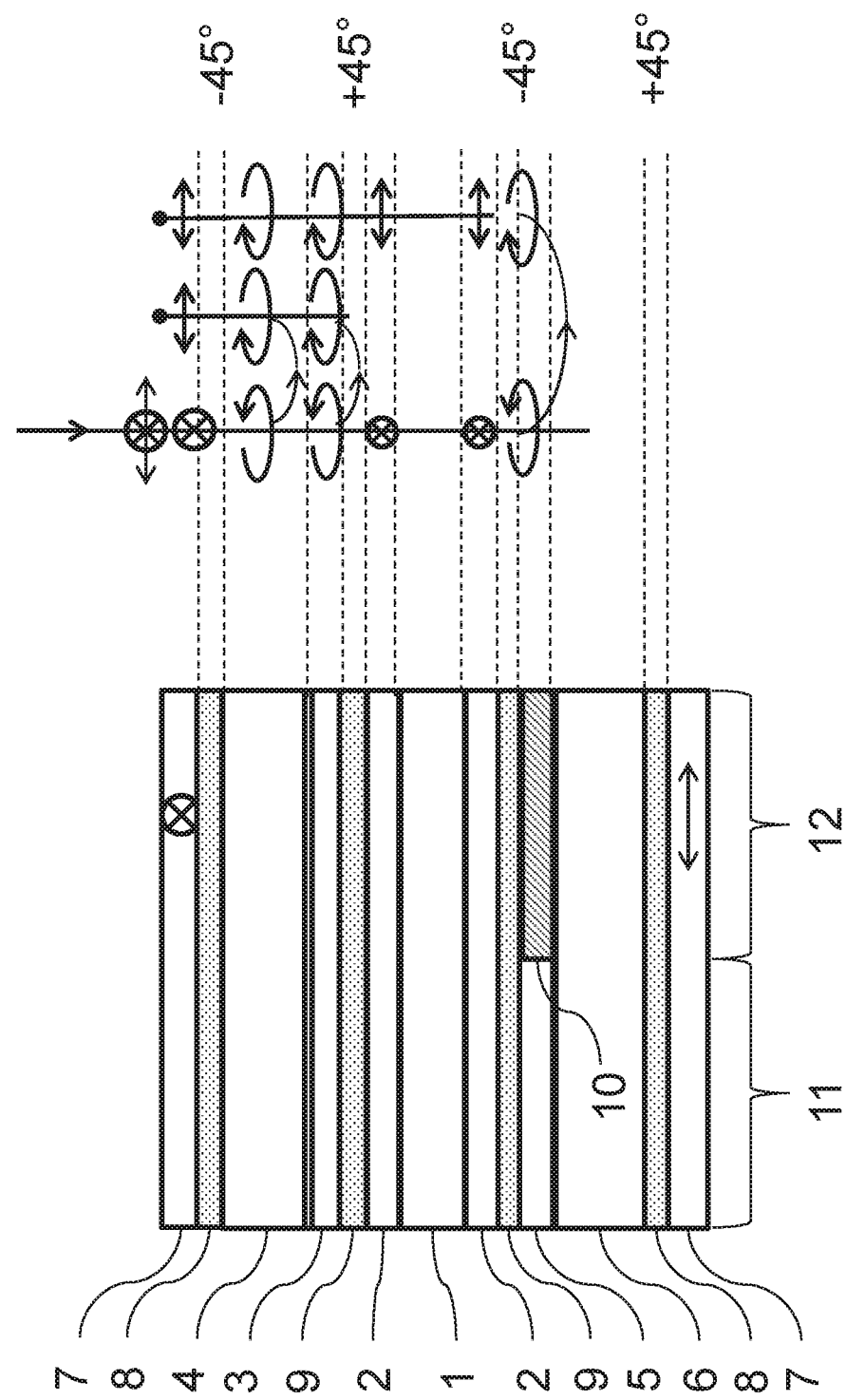
FIGS. 9 and 10: are schematics of the LCD optical stack arrangement of FIG. 7 illustrating operation of the reflective pixel region of a pixel area, respectively, in the off minimal reflection and on maximum reflection states.
Figure 10:
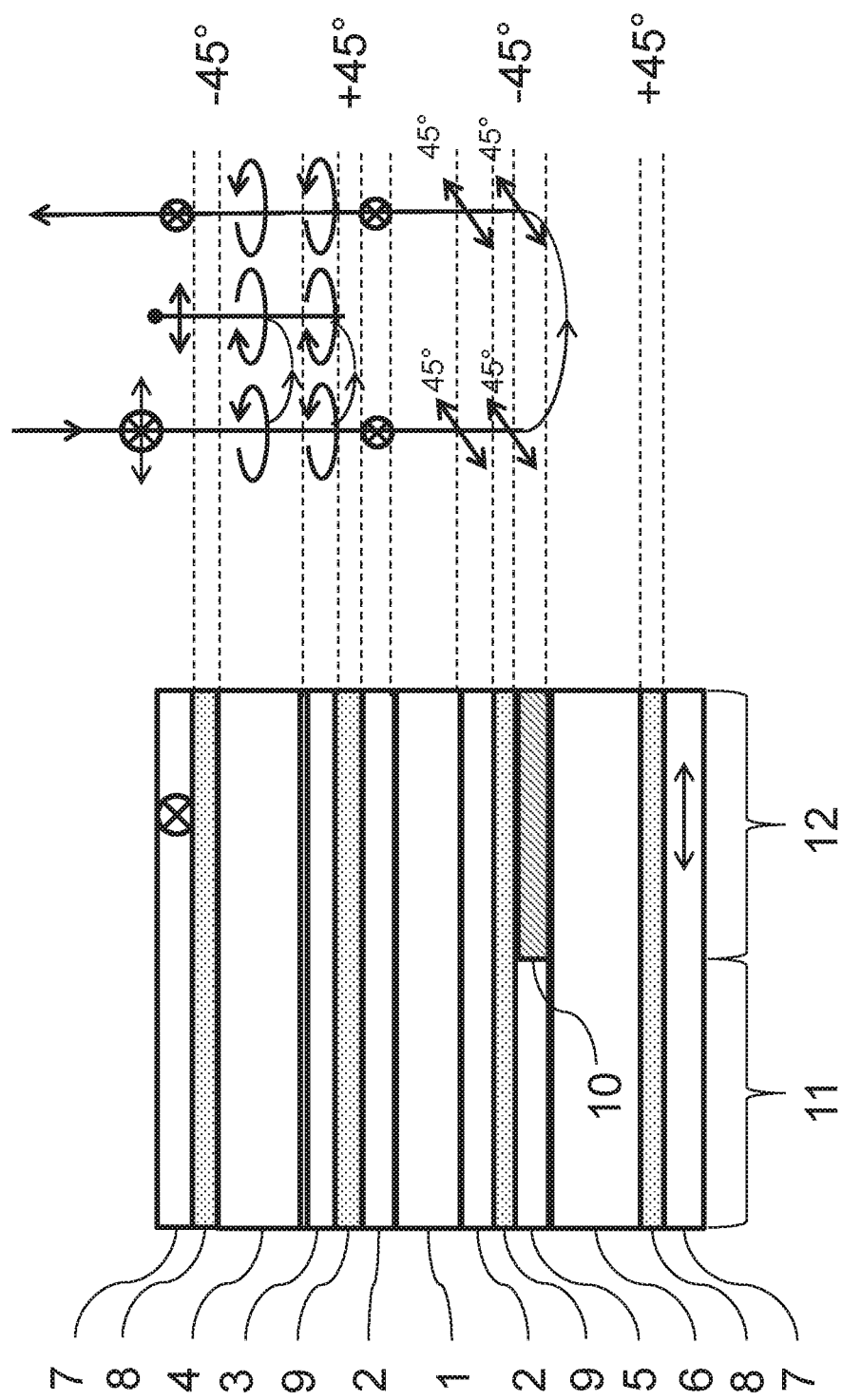

The operation of the display of this embodiment, e.g., as illustrated in FIGS. 7 and 8, in the transmissive region is identical to that of the device of FIGS. 5 and 6. The operation of the display in the reflective region is illustrated in FIGS. 9 and 10. An example of the azimuthal angles of the internal and external retarders of the upper of and lower substrates are shown on the right hand side of both FIG. 9 and FIG. 10. It can be seen from FIG. 9 that in the zero voltage state, as the LC director remains aligned parallel or perpendicular to the transmission axis of the top polariser (7), the polarisation state is unaffected by the internal and external retarder combination of the upper substrate, and the polarisation state is also unaffected by the LC layer and so light is incident upon the lower substrate internal retarder in the same polarisation state as transmitted by the top polariser (7). This lower substrate internal retarder has an optic axis at + or −45° to the polariser transmission axis, and so converts the light to a circular polarisation state before it is incident on the mirror (10). Reflection by the mirror (10) reverses the handedness of this circular polarisation so that on returning through the lower internal polariser it is converted to the orthogonal linear polarisation state. The polarisation state of the light remains unchanged by the internal and external retarder combination of the upper substrate, and so is absorbed by the top polariser, resulting in minimum transmission.

Reference is made to FIG. 10. In the high reflection state shown in FIG. 10, the applied voltage to the LC causes linearly polarised light incident on the LC layer to be rotated by approximately 45°. In essence, the applied voltage causes the LC layer to form a half waveplate (half wave retarder) with optic axis orientated at approximately 22.5°. The light is now linearly polarised parallel or perpendicular to the optical axis of the lower substrate internal retarder, so the polarisation state will be unaffected by this layer. The mirror (10) will then return the light back into the lower substrate internal retarder layer with the same 45° linear polarisation state, which will then again be unaffected by this retarder. Re-transmission through the LC layer with 22.5° director orientation will then return the polarisation state of the light back to the linear state it originally entered the LC layer with, and again this will be unchanged by the combination of internal and external retarders on the upper substrate, so will be re-transmitted by the upper polariser resulting in maximum brightness for the viewer.

It will be noted that the operation of the device as described relies on the conversion of the light by the LC layer (1) into a linear state either parallel or perpendicular to the optic axis of the lower internal retarder for the bright state, or at 45° to the optic axis of the lower internal retarder for the dark state. At intermediate voltages, used for intermediate transmission in the transmissive region (11), the LC layer (1) may impose on the polarisation state of the light a rotation of between 0° and 45°, and may induce a degree of ellipticity. In this case, the proportion of light reflected by the reflection region of the pixel may not match the proportion of light transmitted by the transmissive regions, and so the effective voltage-luminance curve of the two regions combined may change with changing relative illumination from the backlight and ambient illumination. In general, an intermediate voltage used for intermediate transmission in the transmissive region (11) will produce a reflection from the reflective region (12) that is intermediate of the minimum and maximum reflectivity states.

Variations on any of the above embodiments exist which may provide additional advantages. For example, due to the devices of this invention having strongly suppressed reflections from any layers between the internal and external retarders (while the light is circularly polarised), then higher reflecting materials may be used in these layer if these may be cheaper or more economical to incorporate than standard versions of these layers which may be optimised for low reflectivity. For example the colour filter layer may be made of a higher reflectivity material, and the black mask layer (typically incorporated in the colour filter layer) may be made of metal or other reflective material which is strongly absorbing for light transmitted from the backlight, as this may enable the layers to be made thinner. Additionally, if metal may be used as part, or all of, the black masking layer on the upper substrate, this may allow the metal black mask layer to assume a dual function as at least part of the electrode structure for an in-cell touch panel architecture. Alternatively, additional metal, metal mesh, or ITO or other transparent but to some extent reflective electrodes may be incorporated onto the top substrate, along with the standard black mask layer, in order to form at least part of an in-cell or hybrid in-cell, or on-cell touch panel, and the additional reflectivity these layers would normally produce may be suppressed due to them now being situated between the internal and external retarders.

Figure 11:
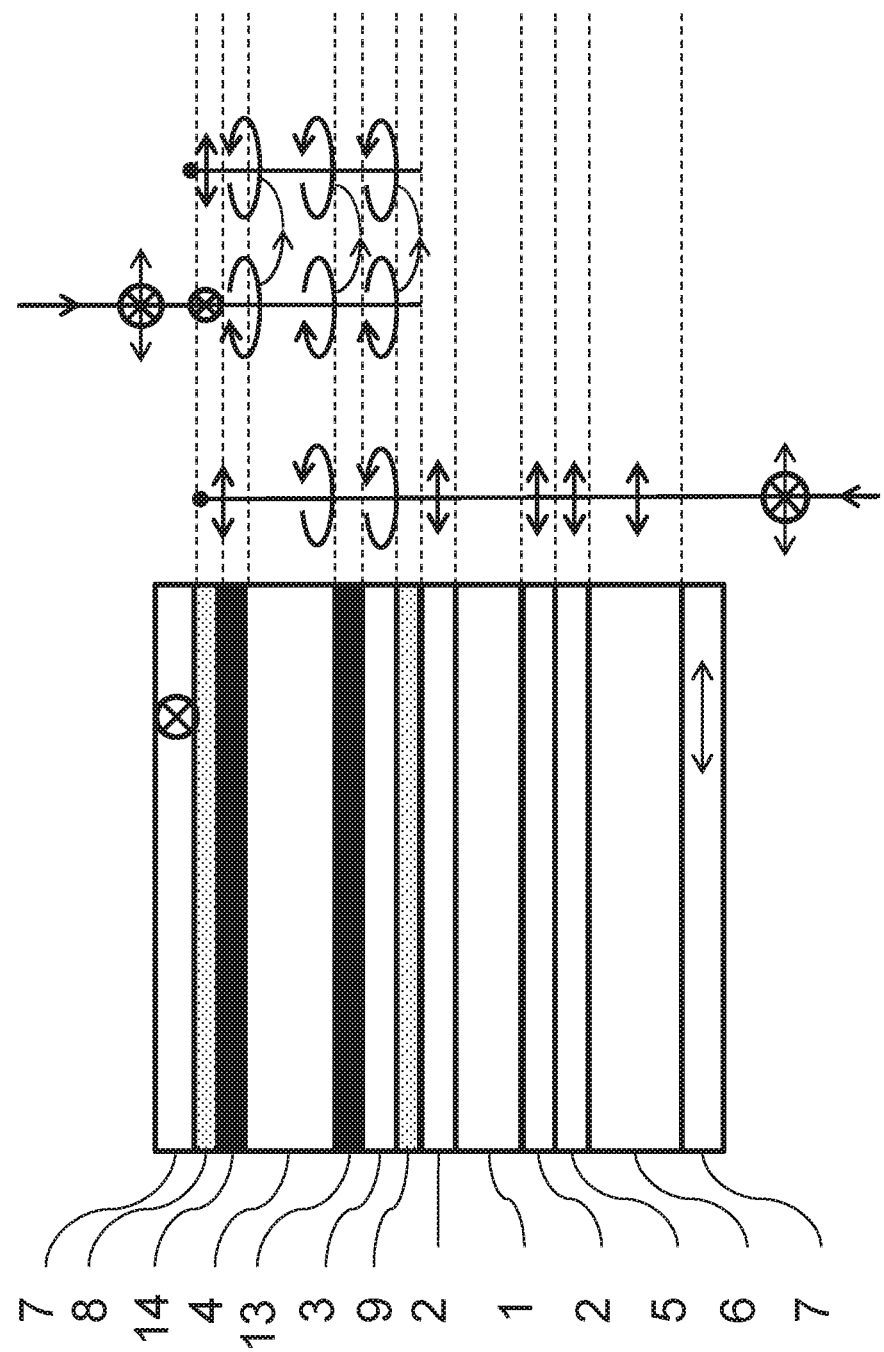
FIG. 11: is a schematic of the LCD optical stack arrangement of an embodiment of this invention including drive and sense electrodes for a touch panel.

In FIG. 11 the above is shown as a variation on the embodiment of FIG. 2, in which the drive (13) and sense (14) electrodes of a typical hybrid in-cell touch panel implementation are shown. In a standard implementation of this type, the drive electrodes are metallic and positioned underneath the black mask layer so as to prevent them reflecting ambient light, which both adds additional complexity and limits the extent of display area these electrodes may occupy, and their geometry, which may impact on touch panel performance. When combined with an optical arrangement of this invention, however, the black mask and drive electrode layers may be combined to be formed of a single metallic layer, and the additional reflections this creates will be suppressed at the top polariser. Also, the sense electrodes (14) typically positioned at the outer surface of the top substrate and comprised of ITO to maximise transmission and minimise reflection, may now occupy a greater area, or be comprised of metal mesh or other transmissive material with higher reflectivity, which may offer greater conductivity and therefore touch panel sensitivity, while again having the additional reflections this would normally produce suppressed by the top polariser.

Additionally, one or more extra ITO or transparent conductor layers may be included in the display stack without causing the uncontrolled, unwanted reflections suffered by the conventional FFS design. For example, a low resistivity ITO layer between the colour filter and external polariser may be used to reduce electromagnetic interference from the display affecting the operation of a touch panel disposed on the viewer side of the display panel. Also, this ITO layer may be of high resistivity, so as to act as a barrier to prevent ionic material contamination between layers of the display, and/or acting as a shield layer for electromagnetic interference between signals applied to the TFT substrate and a touch panel, while not negatively impacting the operation of an in-cell touch panel.

Figure 12:
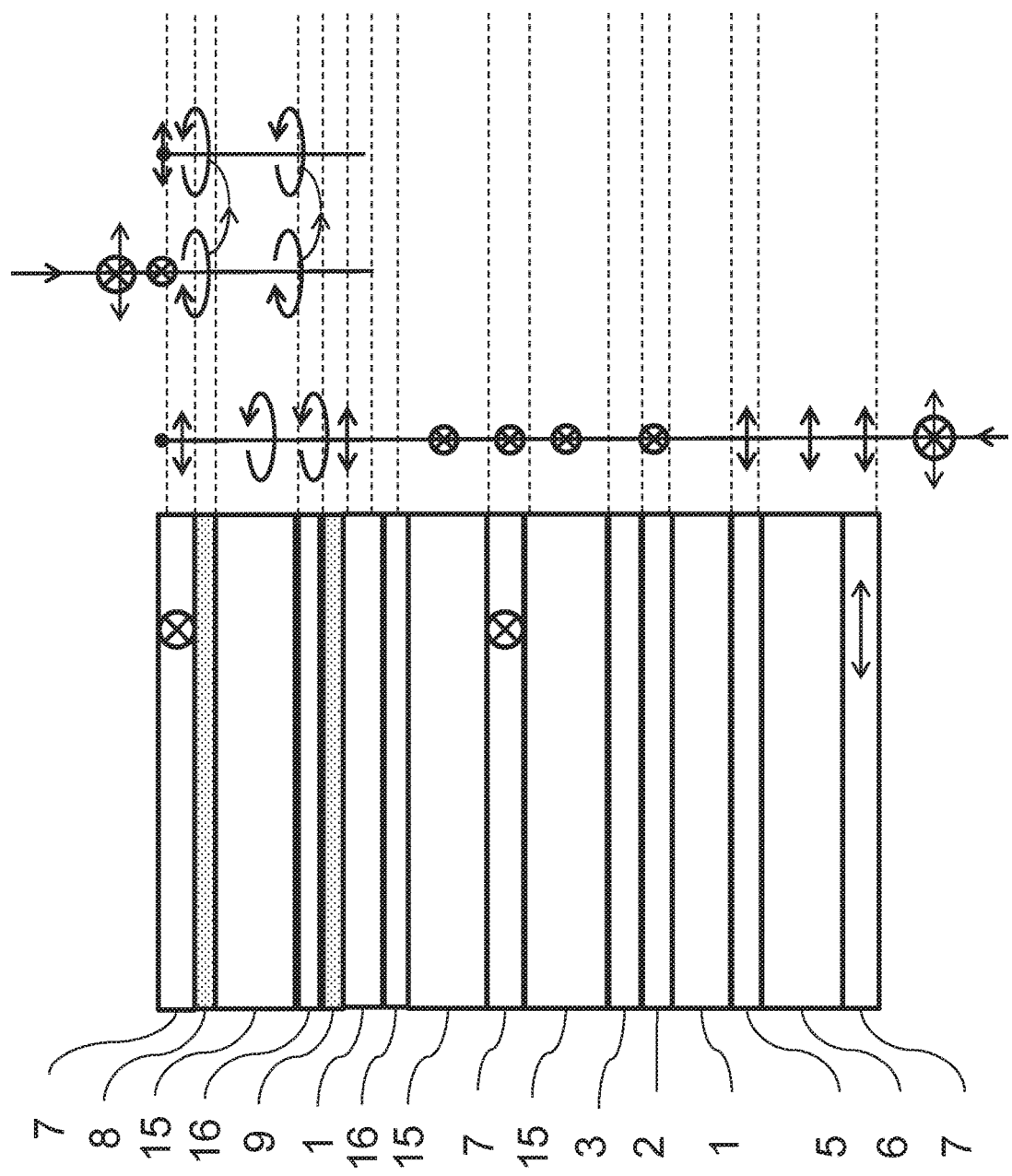
FIG. 12: is a schematic of a LCD optical stack arrangement of an embodiment of this invention including an additional liquid crystal cell.

Reference is made to FIG. 12. Also, an additional liquid crystal cell with upper and lower intermediate substrates (15) with, for example, a passive matrix of transparent electrodes (16) which may have some degree of unwanted reflectivity may be incorporated between the external and internal retarders, in order to provide some additional function such as a switchable 3D, privacy or mirror mode, while allowing added reflections from the additional layer and electrodes to be suppressed. In this case, the internal retarder may be located in the inner surface of the view-side substrate of the additional LC cell, so as to return ambient light propagating towards the lower substrate back to a linear state before entering the additional LC layer, and allow both the basic display LC layer, and additional LC cell to operate as normal with linearly polarised input light. This arrangement is shown in FIG. 12, in the example case where light from the backlight is transmitted by the main LC cell, and then blocked by the additional LC cell. In all states of both LC layers though, ambient light reflected by the top substrate and top additional electrode layers will be suppressed by the method of the previous embodiments.

By the same reasoning, additional reflective elements, or existing elements comprised of higher reflectivity material than standard may also be included on the bottom substrate, to provide a touch panel implementation, or allow incorporation of other additional function, as modifications to the embodiments of FIG. 4 or 5.

With reference to FIG. 13A, an in-plane switching LCD, such as an IPS or FFS LCD, is shown that has an alternative configuration of optical components that enables reduced ambient light reflections. Like components of previous embodiments are afforded comparable reference numerals. The enhanced structural features and performance of the LCD shown in FIG. 13A arise from the positioning and orientation of the external quarter waveplate ($\lambda/4$) (8), the internal quarter waveplate ($\lambda/4$) (9), and an alignment layer (17) for the internal quarter waveplate ($\lambda/4$) (9) in relation to other components of the LCD. The structural configuration shown in FIG. 13A enables enhanced optical performance of the LCD. An advantage of the LCD shown in FIG. 13A over the LCD shown in FIG. 2, for example, is that the LCD shown in FIG. 13A may have a higher dark room contrast ratio as compared to the LCD shown in FIG. 2.

The LCD shown in FIG. 13A includes from the viewing side: a first linear polariser with a transmission axis in a first direction (7), an external quarter waveplate ($\lambda/4$) (8), a top substrate (4), a patterned black mask layer (18), an alignment layer for the internal ($\lambda/4$) (17), an internal quarter waveplate ($\lambda/4$) layer (9), a layer of patterned colour filters (3), an overcoat layer (19), a first alignment layer for the LC (2), the LC layer (1), a second alignment layer for the LC (2), a patterned TFT layer or active matrix electronics (5), a bottom substrate (6), and a second linear polariser (7) with a transmission axis in a second direction that is perpendicular to the first direction. The external quarter waveplate ($\lambda/4$) may be a laminated film and may be comprised of a cyclo-olefin polymer (COP) material. The internal quarter waveplate ($\lambda/4$) may be comprised of a reactive mesogen (RM) material as described previously. As further referenced previously, an alignment layer may be desirable for aligning the RM material of the RM internal quarter waveplate ($\lambda/4$) (9). In this embodiment, an alignment layer for the internal quarter wave plate (17) promotes an alignment direction of the reactive mesogen material of the internal quarter wave plate (9) at 45° to the transmission axis direction of the first linear polariser.

FIGS. 3a, 3b and 3c show other various arrangements between the first polariser (top polariser), the second polariser (bottom polariser), the external quarter waveplate ($\lambda/4$) and the internal quarter waveplate ($\lambda/4$). Additionally in the embodiment of FIG. 13A, the patterned black mask (18) is a typical non-transmissive layer as used in a conventional LCD. The patterned colour filter layer (3) is typical of a conventional LCD. The overcoat layer (19) may be used to planarize the patterned colour filter layer.

As described previously and further with reference to FIG. 13A, the combination of the first linear polariser and the external quarter waveplate ($\lambda/4$) retarder forms a circular polariser. For example, the first linear polariser has a transmission axis arranged in a first direction and the optical axis of a positive uniaxial type external quarter waveplate ($\lambda/4$) is arranged to be at 45° to the first direction. As shown above, the orientation of the external quarter waveplate ($\lambda/4$) retarder and the internal quarter waveplate ($\lambda/4$) retarder are arranged so that the optical function of the external quarter waveplate ($\lambda/4$) is negated by the optical function of the internal quarter waveplate ($\lambda/4$), and vice versa. Consequently, the circular polariser (first linear polariser combined with the external quarter waveplate) is used to make the light circularly polarised as the light traverses the multiple reflective layers between the first polariser and LC layer. Then, the internal quarter waveplate operates to convert the light back to linear polarisation before the light enters the LC layer, so the display can operate as normal.

The LCD shown in FIG. 13B is an alternative arrangement of optical components that enable a transflective function. In essence, FIG. 13B combines aspects of embodiments previously described and shown in FIGS. 7, 8 and 13A. FIG. 13B includes the addition of a reflective layer (10) between the bottom substrate (6) and LC layer (1), a second external quarter waveplate ($\lambda/4$) (8) positioned between the bottom polariser (7) and the bottom substrate (6), and a second internal quarter waveplate (9) positioned between the TFT layer (5) and the LC layer (1), wherein the additional internal quarter waveplate (9) is also positioned on the viewing side of the reflective layer (10).

With reference to FIG. 14A, an in-plane switching LCD, such as an IPS or FFS LCD, is shown that has an alternative configuration of optical components that enables reduced ambient light reflections. Many features of FIG. 14A have been previously described in connection with other embodiments, and like reference numerals identify like components. In this embodiment also, the LCD includes the alignment layer for the internal quarter wave plate (17) that promotes an alignment direction of the reactive mesogen material of the internal quarter wave plate (9) at 45° to the transmission axis direction of the first linear polariser. FIGS. 3a, 3b and 3c show other various arrangements between the first polariser (top polariser), the second polariser (bottom polariser), the external quarter waveplate (λ/4) and the internal quarter waveplate (λ/4). The enhanced structural features and performance of the LCD shown in FIG. 14A arise from the positioning and orientation of the external quarter waveplate (λ/4) (8), the internal quarter waveplate (λ/4) (9), and the alignment layer for the internal quarter waveplate (λ/4) (17) in relation to other components of the LCD. The structural configuration shown in FIG. 14A enables enhanced optical performance and functionality of the LCD. An advantage of the LCD shown in FIG. 14A over previously described embodiments is that fabricating the TFT active matrix electronics layer (5), and a combined patterned black mask and colour filter layer (20), on the same substrate enables an LCD that can be flexed, curved or bent while maintaining good optical performance. Such configuration also may enable lower cost fabrication.

FIG. 14B is a variation on the configuration of FIG. 14A. The LCD shown is FIG. 14A and the LCD shown in FIG. 14B generally have the same optical components, but the ordering of the optical components is different. By changing the ordering of the optical components, the LCD shown in FIG. 14B may have a higher dark room contrast ratio than the LCD configuration of FIG. 14A. In contrast, the LCD shown in FIG. 14A may have a lower ambient reflectance than the LCD shown in FIG. 14B. Accordingly, either configuration may be employed as being more suitable for a given application.

An FFS or IPS type LCD is provided which includes a TFT substrate for one or more pixels; a second substrate disposed on the viewing side of the LCD; at least a first circular polariser disposed not between the TFT and second substrate; and at least a first unpatterned retarder disposed between the TFT and second substrate.

According to an aspect, the second substrate comprises a CF substrate, the circular polariser is disposed on the outer surface of the CF substrate, and the unpatterned retarder is disposed on the inner surface of the CF substrate According to another aspect the circular polariser is disposed on the outer surface of the TFT substrate, and the unpatterned retarder is disposed on the inner surface of the TFT substrate In yet another aspect, the second substrate comprises a CF substrate, circular polarisers are disposed on the outer surfaces both the TFT and CF substrates, and internal retarders are disposed on the inner surfaces of both substrates.

In still another aspect, the circular polariser includes a retarder used as part of the circular polariser, and the internal retarders or unpatterned retarder are either of the same birefringence polarity and oriented with their optics axes at 90° to each other, or are of opposite birefringence polarity and have their optic axes oriented parallel.

In accordance with another aspect, the display is a transflective type LCD, and the reflective portion of the pixel area comprises a reflective element disposed between the unpatterned retarder on the inner surface of the TFT substrate and the circular polariser on the outer surface of the TFT substrate.

In still another aspect, included is a pixel electrode formed of electrode fingers to apply electric field to a liquid crystal layer and in which the electrode finger angle of the pixel electrode is different in the transmissive and reflective portions of the pixel.

In yet another aspect, additional at least partially reflective layers are included between the circular polariser and unpatterned retarder on either or both substrates, in order to provide an additional function or replace an existing layer of lower reflectivity.

According to another aspect, electrodes of a touch panel are included between the circular polariser and unpatterned retarder on either or both substrates.

According to another aspect, the LCD structure reduces unwanted reflections from at least part of the display area of the LCD.

According to another aspect, a liquid crystal display having a number of components is provided including a liquid crystal light modulator, a linear polarizer in the path of light to or from the liquid crystal light modulator, and a pair of optical retarders in the light path configured to cooperate to attenuate light caused by surface reflections from one or more components of the liquid crystal display while permitting normal operation of the liquid crystal light modulator.

According to yet another aspect, the liquid crystal light modulator is an FFS or IPS liquid crystal device.

In accordance with another aspect, one of the optical retarders is cooperative with the linear polarizer as a circular polarizer configured to impart circular polarization in one handedness to light transmitted therethrough, and wherein surface reflection of such circular polarized light back toward the circular polarizer reverses the handedness of circular polarization such that the circular polarizer tends to block transmission therethrough of such reverse direction circular polarized light.

In yet another aspect, the other optical retarder is in the light path between the circular polarizer and the liquid crystal light modulator and is configured to convert incident circular polarized light to plane polarized light for modulation by the liquid crystal light modulator.

According to still another aspect, the retarders are quarter wave plates.

In accordance with another aspect, the liquid crystal display is a transflective display.

According to another aspect, the transflective display having two parts of a pixel area, one part including a reflector in the light path to reflect light transmitted through the liquid crystal light modulator back through the liquid crystal light modulator and the other part including a light path from a light input at one end of the liquid crystal display to a light output at the other end of the liquid crystal display.

According to still another aspect, the liquid crystal display includes a further liquid crystal light modulator of the passive electrode type in optical series with the liquid crystal light modulator.

In still another aspect, the pair of optical retarders are located on or in the further liquid crystal light modulator of the passive electrode type.

INDUSTRIAL APPLICABILITY

The embodiments of this invention are applicable to many display devices, and a user may benefit from the capability of the display to provide improved display visibility under higher ambient illumination, without the need for increased backlight power, particularly where the display is battery powered. Examples of such devices include mobile phones, Personal Digital Assistants (PDAs), tablet and laptop computers, desktop monitors, and digital cameras.

The invention claimed is:

1. An FFS or IPS type LCD comprising, from the viewing side:
   a first linear polariser with a transmission axis in a first direction;
   an unpatterned external quarter wave plate with an optical axis arranged at 45° to the first direction;
   a top substrate;
   a patterned black mask layer;
   a reactive mesogen alignment layer that promotes an alignment direction of a reactive mesogen material at 45° to the first direction;
   an unpatterned internal quarter wave plate that is comprised of the reactive mesogen material;
   a patterned colour filter layer
   a first LC alignment layer
   an LC layer that is aligned in a direction that is either parallel to, or perpendicular to, the first direction;
   a second LC alignment layer;
   a patterned TFT layer for one or more pixels;
   a bottom substrate; and
   a second linear polariser with a transmission axis in a second direction that is perpendicular to the first direction.

2. The FFS or IPS type LCD of claim 1, wherein the linear polariser and the unpatterned external quarter wave plate form a circular polariser, and the internal quarter wave plate or external quarter waveplate are either of the same birefringence polarity and oriented with their optics axes at 90° to each other, or are of opposite birefringence polarity and have their optic axes oriented parallel.

3. The FFS or IPS type LCD of claim 2, in which the LCD is a transflective type LCD, the LCD including a pixel area having a reflective portion comprising a reflective element disposed between the bottom substrate and LC layer.

4. The FFS or IPS type LCD of claim 2, wherein the LCD is a transflective type LCD, the LCD including a second external quarter wave plate positioned between the second linear polariser and the bottom substrate.

5. The FFS or IPS type LCD of claim 2, wherein the LCD is a transflective type LCD, the LCD including a second internal quarter waveplate positioned between the TFT layer and the LC layer.

6. The FFS or IPS type LCD of claim 3, further comprising a pixel electrode formed of electrode fingers to apply an electric field to the LC crystal layer and in which an electrode finger angle of the pixel electrode is different in transmissive and reflective portions of the pixel.

7. The FFS or IPS type LCD of claim 2, further comprising an additional at least partially reflective layer included between the circular polariser and the internal quarter wave plate.

8. The FFS or IPS type LCD of claim 2, in which electrodes of a touch panel are included between the circular polariser and the internal quarter wave plate.

9. The FFS or IPS type LCD of claim 1, in which the LCD is a transflective type LCD having first and second parts of a pixel area, the first part including a reflector in the light path to reflect light transmitted through the LC layer back through the LC layer, and the second part including a light path from a light input at one end of the LCD to a light output at an opposite end of the LCD.

10. The FFS or IPS type LCD of claim 1, wherein the external quarter waveplate is a laminated film that includes a cyclo-olefin polymer (COP) material.

11. The FFS or IPS type LCD of claim 1, wherein an overcoat layer is deposited on the non-viewing side of the patterned colour filter layer.

12. An LCD structure including the FFS or IPS type LCD of claim 1 and a display area comprising one or more pixels, wherein the FFS or IPS type LCD is configured to reduce unwanted reflections from at least part of the display area of the LCD structure.

13. An FFS or IPS type LCD comprising, from the viewing side:
   a first linear polariser with a transmission axis in a first direction;
   an unpatterned external quarter wave plate with an optical axis arranged at 45° to the first direction;
   a top substrate;
   a patterned TFT layer for one or more pixels;
   a layer comprising in combination a patterned black mask and patterned colour filters;
   a reactive mesogen alignment layer that promotes an alignment direction of a reactive mesogen material at 45° to the first direction;
   an unpatterned internal quarter wave plate that is comprised of the reactive mesogen material;
   a first LC alignment layer;
   an LC layer that is aligned in a direction that is either parallel to, or perpendicular to, the first direction;
   a second LC alignment layer;
   a bottom substrate; and
   a second linear polariser with a transmission axis in a second direction that is perpendicular to the first direction.

14. The FFS or IPS type LCD of claim 13, wherein the linear polariser and the unpatterned external quarter wave plate form a circular polariser, and the internal quarter wave plate or external quarter waveplate are either of the same birefringence polarity and oriented with their optics axes at 90° to each other, or are of opposite birefringence polarity and have their optic axes oriented parallel.

15. The FFS or IPS type LCD of claim 13, wherein an overcoat layer is deposited on the non-viewing side of the layer comprising in combination the patterned black mask and patterned colour filters.

16. An LCD structure including the FFS or IPS type LCD of claim 13 and a display area comprising one or more pixels, wherein the FFS or IPS type LCD is configured to reduce unwanted reflections from at least part of the display area of the LCD structure.

17. An FFS or IPS type LCD comprising, from the viewing side:
   a first linear polariser with a transmission axis in a first direction;
   an unpatterned external quarter wave plate with optical axis arranged at 45° to the first direction;
   a top substrate;
   a patterned TFT layer for one or more pixels;
   a reactive mesogen alignment layer that promotes an alignment direction of a reactive mesogen material at 45° to the first direction;
   an unpatterned internal quarter wave plate that is comprised of the reactive mesogen material;
   a layer comprising in combination a patterned black mask and patterned colour filters;
   a first LC alignment layer an LC layer that is aligned in a direction that is either parallel to, or perpendicular to, the first direction;

a second LC alignment layer;

a bottom substrate; and a second linear polariser with a transmission axis in a second direction that is perpendicular to the first direction.

18. The FFS or IPS type LCD of claim 17, wherein the linear polariser and the unpatterned external quarter wave plate form a circular polariser, and the internal quarter wave plate or external quarter waveplate are either of the same birefringence polarity and oriented with their optics axes at 90° to each other, or are of opposite birefringence polarity and have their optic axes oriented parallel.

19. The FFS or IPS type LCD of claim 17, wherein an overcoat layer is deposited on the non-viewing side of the layer comprising in combination a patterned black mask and patterned colour filters.

20. An LCD structure including the FFS or IPS type LCD of claim 17 and a display area comprising one or more pixels, wherein the FFS or IPS type LCD is configured to reduce unwanted reflections from at least part of the display area of the LCD structure.

* * * * *